United States Patent [19]

Hahs, Jr. et al.

[11] Patent Number: 5,235,736

[45] Date of Patent: Aug. 17, 1993

[54] SELF-FIXTURING METHOD FOR ASSEMBLING AN ANTENNA/RECEIVER COMBINATION

[75] Inventors: Charles A. Hahs, Jr.; Gustavo G. Suarez, both of Boca Raton, Fla.

[73] Assignee: Motorola, Inc., Schaumburg, Ill.

[21] Appl. No.: 898,861

[22] Filed: Jun. 15, 1992

[51] Int. Cl.⁵ ............................................. H01P 11/00
[52] U.S. Cl. ........................................ 29/600; 29/837; 343/700 MS
[58] Field of Search .................... 29/600, 837, 592.1; 361/394, 400; 174/35 GC; 343/700 MS

[56] References Cited

U.S. PATENT DOCUMENTS

| | | | |
|---|---|---|---|
| 3,331,128 | 7/1967 | Laurent et al. | 29/837 |
| 3,916,515 | 11/1975 | Walsh et al. | 29/837 |
| 3,946,397 | 3/1976 | Irwin. | |
| 4,791,717 | 12/1988 | Hemmie | 29/600 |
| 4,862,181 | 8/1989 | Ponce De Leon et al. | |

FOREIGN PATENT DOCUMENTS 1534210 11/1978 United Kingdom.

*Primary Examiner*—Carl J. Arbes
*Attorney, Agent, or Firm*—Kelly A. Gardner; William E. Koch; Thomas G. Berry

[57] ABSTRACT

A method for assembling an antenna/receiver combination (305) comprises the step of forming a receiver (210) and an antenna (205) into printed circuit board material, wherein the antenna (205) is adjacent to and aligned with the receiver (210). Thereafter, the antenna (205) is electrically coupled to the receiver (210) while aligned therewith. A further step includes separating the antenna (205) and the receiver (210) from the printed circuit board material.

17 Claims, 1 Drawing Sheet

SELF-FIXTURING METHOD FOR ASSEMBLING AN ANTENNA/RECEIVER COMBINATION

FIELD OF THE INVENTION

This invention relates in general to automated assembly, and more specifically to an automated method for assembling an antenna/receiver combination.

BACKGROUND OF THE INVENTION

With the advances in technology in recent years, many complex electronic devices have been designed and mass produced for comsumption by the public. Typically, the production of such an electronic device, such as a paging receiver, may include hundreds of components which require numerous assembly processes. In each assembly process, components must be correctly identified, aligned, and assembled either manually, by human operators, or, if suitable, by automated equipment. Additionally, some components, such as antennas, require precision alignment and assembly to meet electrical and mechanical requirements.

Some conventional paging receivers avoid possible antenna alignment problems by designing an antenna directly into a receiver board. Such an antenna may be etched into the printed circuit receiver board, making assembly operations unnecessary. In this manner, inaccuracies other than at the printed circuit board level are eliminated. Although the process of manufacturing such a device is readily implemented when the receiver board has available space for incorporation of a small antenna, this process is useless when applied to antennas which are too large to be included on the receiver board.

Conventionally, larger antennas for paging receivers are manufactured separately from the receiver board because of space considerations, i.e., the area of the receiver board is typically too small to accommodate the manufacture of a larger antenna directly on the board. These separately manufactured antennas must be designed, ordered, and stocked separately from other components, resulting in greater product cost and inefficient space utilization. Furthermore, use of a separate antenna increases the possibility of component identification and ordering errors.

If the design of a paging receiver dictates the use of a separate antenna, the antenna is typically pre-formed from a rigid conductive material, such as copper. The pre-formed antenna must then be plated with a solderable conductive material before it can be soldered to contacts on the receiver board. Because pre-formed antennas typically have large dimensional tolerances, the areas of the antenna which are to be soldered to the receiver board often, even with the aid of an alignment fixture, incorrectly contact the receiver board. In such a case, the antenna must be manually forced into alignment with the receiver board contacts, thereby contributing to further assembly errors and greater expenditure of time. If the process used to assemble the antenna to the receiver board is performed incorrectly, an operator may find it necessary to resolder the antenna or to simply dispose of the incorrect assembly. In either case, the result is wasted time and money, which is usually reflected in an increased product cost.

Thus, what is needed is a self-fixturing method for assembling an antenna/receiver combination.

SUMMARY OF THE INVENTION

A method for assembling an antenna/receiver combination comprises the step of forming a receiver and an antenna into printed circuit board material, wherein the antenna is adjacent to and aligned with the receiver. Thereafter, the antenna is electrically coupled to the receiver while aligned therewith. A further step includes separating the antenna and the receiver from the printed circuit board material.

DESCRIPTION OF A PREFERRED EMBODIMENT

Figure 1:
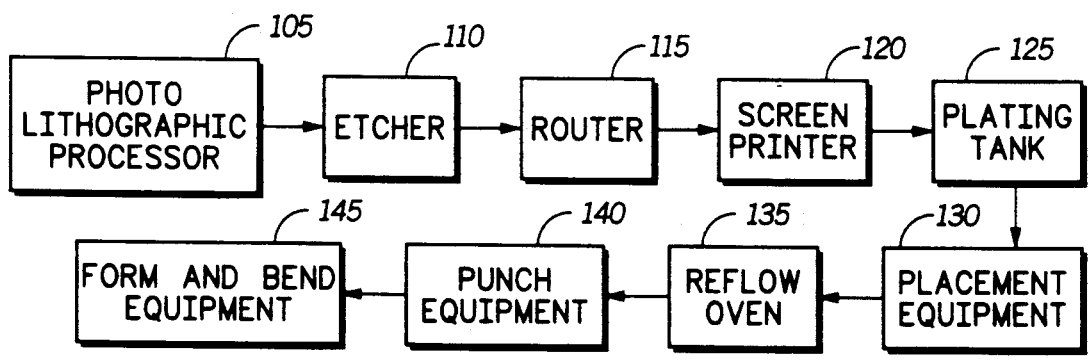
FIG. 1 is a block diagram depicting a manufacturing process in accordance with a preferred embodiment of the present invention.

Referring to FIG. 1, a block diagram depicts a self-fixturing manufacturing process for manufacture and assembly of an antenna and a receiver. In accordance with a preferred embodiment of the present invention, a printed circuit board array of antennas and receivers is formed into printed circuit board material. The initial step in the formation process involves imprinting a photographic image of the array onto the printed circuit board material by use of a device such as a photolithographic processor 105. The resulting array is preferably imprinted onto the printed circuit board material in such a manner as to efficiently use the space available on the printed circuit board material, as may be better understood by referring to FIG. 2.

Figure 2:
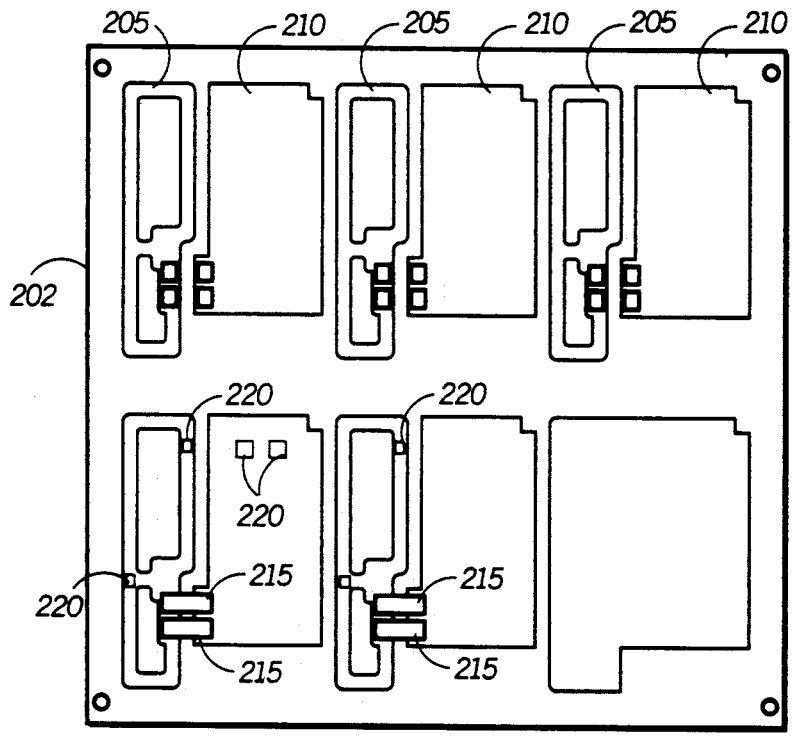
FIG. 2 depicts an array of antennas and receivers formed into printed circuit board material in accordance with the preferred embodiment of the present invention.

FIG. 2 depicts an array 202 of antennas 205 and receivers 210, which may be formed into antenna/receiver combinations, which are configured into printed circuit board material such that the available space is efficiently utilized. In accordance with the preferred embodiment of the present invention, each antenna 205 is adjacent to and aligned with a receiver 210. In this manner, areas of the printed circuit board material that are too small to accommodate further receivers 210 are used to form the smaller antennas 205 in alignment with the receivers 210, thereby preventing excessive waste of the printed circuit board material. Furthermore, the formation of the antennas 205 and the receivers 210 into the same printed circuit board material eliminates many of the problems, such as ordering and stocking, associated with use of a separately manufactured antenna.

Returning to FIG. 1, the imprinted array 202 (FIG. 2) is preferably processed by etching equipment 110 to remove conductive material not indicated by the photolithographic image. This process selectively etches metallization from the printed circuit board material to form conductive channels between different areas of the antennas 205 and the receivers 210. The amount of metallization to be etched from each antenna 205 is determined by antenna type, for example, single loop or double loop. Typically, only one surface of a single loop antenna remains coated with the conductive material, whereas, for creation of a double loop antenna, two surfaces of the antenna remain coated with the conductive material. In the latter case, the two conductive surfaces are electrically coupled in a manner to be described below. Each receiver 210 (FIG. 2) in the array 202 is further etched to remove the conductive material on one or more surfaces depending on the quantity of components that are to be placed on the receiver 210.

Thereafter, excess material is trimmed from the etched array 202 (FIG. 2), preferably by routing equipment 115, to define the shapes of the antennas 205 and the receivers 210. The routing equipment 115 further drills via holes between the surfaces on the antennas 205 and the receivers 210 that are to be electrically coupled, as in the case of a double loop antenna. The array 202 is then laminated with a non-conductive material, e.g., photo-resist, by equipment such as a screen printer 120. During this process, metallized areas, for example, component pads 220 (FIG. 2), of the array 202 whereupon components, such as resistors and capacitors, are to be placed remain exposed. Additionally, any via holes drilled during the routing process remain exposed. The exposed metallized areas of the array 202, e.g., those that are not laminated, are thereafter plated, during which process the exposed metallized areas, including the component pads 220 and the drilled via holes, are typically coated with a solderable conductive material, such as tin, in a plating tank 125. In this manner, the metallized surfaces may be electrically coupled by the plating of the drilled via holes. Although, in accordance with the preferred embodiment of the present invention, the component pads 220 (FIG. 2) are described as being plated with a solderable conductive material, alternate embodiments may incorporate, rather than the plating process, a process by which another conductive material, such as conductive adhesive, is applied to the component pads 220.

Subsequent to the plating of the antennas 205 and receivers 210, conductive contacts 215 (FIG. 2) are placed such that they provide electrical contact between each receiver 210 and the nearest antenna 215. The contacts 215 are preferably formed from a malleable, conductive material that is flexible enough to prevent breakage of the contacts 215 during a bending process. Additionally, electrical components may be included on a receiver 210 or an antenna 205. Components included on the receiver 210 typically consist of circuit elements, such as resistors, capacitors, and inductors, needed to demodulate and decode signals received within a specified frequency band by the receiver 210. Generally, any components included on the antenna 205 (FIG. 2) are chosen so that the antenna 205 operates correctly across the frequency band at which the corresponding receiver 210 operates. The necessary electrical components are placed, preferably simultaneously with the placement of the contacts 215, on the component pads 220 provided for component placement on the antennas 205 and the receivers 210. This placement process is, in accordance with the preferred embodiment of the present invention, performed by automated placement equipment 130.

The array 202 (FIG. 2) is thereafter processed in such a manner as to result in the adhesion of the conductive contacts 215 and the components to the antennas 205 and the receivers 210. Preferably, the conductive contacts 215 and the components are simultaneously reflowably soldered in a reflow oven 135, although it may be appreciated that alternate embodiments, such as those utilizing conductive adhesive rather than plating, may employ other equipment and processes to accomplish similar tasks.

Figures 3, 4:
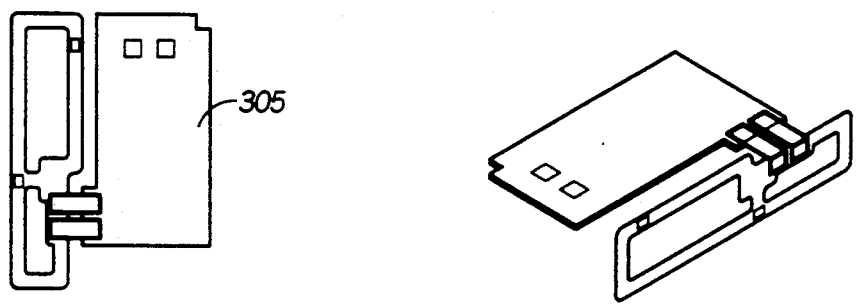
FIG. 3 is an illustration of an antenna/receiver combination subsequent to singulation from the printed circuit board in accordance with the preferred embodiment of the present invention.
FIG. 4 is an illustration of the antenna/receiver combination of FIG. 3 subsequent to formation into a desired physical orientation in accordance with the preferred embodiment of the present invention.

Referring to FIG. 3, once the array 202 (FIG. 2) has been reflowed in the reflow oven 135 (FIG. 1), each resulting antenna/receiver combination 305, consisting of an antenna 205 coupled to a receiver 210, is singulated in a process whereby each antenna/receiver combination 305 is separated from the printed circuit board material. This process may be performed by equipment such as punch equipment 140 (FIG. 1) or routing equipment, such as that used for trimming the array 202. Each antenna/receiver combination 305 is subsequently formed into a desired physical orientation, as shown in FIG. 4. In accordance with the preferred embodiment of the present invention, automated equipment, such as bend and form equipment 145 (FIG. 1), is employed to grasp the antenna/receiver combination 305 and apply sufficient pressure to bend the conductive contacts 215 (FIG. 2). In this manner, the automated bending process becomes more uniform than the manual process, wherein a human operator might bend the antenna/receiver combination 305 at an incorrect angle or perhaps break the antenna/receiver combination 305 by applying too great of a force.

In summary, the self-fixturing method described above, which is applicable for all sizes of antennas, eliminates many of the problems associated with conventional methods of assembling an antenna to a receiver. Because the antenna and the receiver are formed into the same printed circuit board material, the plating, component placement, and reflow processes may be performed simultaneously for both the antenna and the receiver, thus reducing the number of process steps. Problems, such as stocking, ordering, and added component costs, resulting from the use of a separately manufactured antenna are also avoided. Furthermore, the alignment of the antenna with the receiver during the design and manufacturing stage prevents possible alignment errors during the assembly process. Therefore, as a result of the use of the self-fixturing method in accordance with the preferred embodiment of the present invention, the final product cost does not reflect time wasted on additional or incorrectly performed processes.

By now it may be appreciated that there has been provided a self-fixturing method for assembling an antenna/receiver combination.

What is claimed is:

1. A method for assembling an antenna/receiver combination, comprising the steps of:
    (a) forming a receiver into printed circuit board material;
    (b) forming an antenna into the printed circuit board material, wherein the antenna is adjacent to and aligned with the receiver;
    (c) electrically coupling the antenna to the receiver while aligned therewith; and
    (d) separating the antenna and the receiver from the printed circuit board material.

2. The method in accordance with claim 1, further comprising the step of:
    (e) subsequent to step (d), forming the antenna and the receiver into a desired physical orientation.

3. The method in accordance with claim 1, wherein step (c) comprises the steps of:
(f) mounting electrical contacts between the antenna and the receiver; and
(g) reflowably soldering the electrical contacts between the antenna and the receiver.

4. The method in accordance with claim 1, further comprising the step of:
(h) subsequent to step (a), mounting at least one component to the receiver such that the at least one component electrically contacts the receiver.

5. The method in accordance with claim 3, further comprising the steps of:
(i) subsequent to step (a), mounting at least one receiver component to the receiver; and
(j) substantially coincident with step (g), reflowably soldering the at least one receiver component to the receiver.

6. The method in accordance with claim 1, further comprising the step of:
(k) subsequent to step (b), mounting at least one component to the antenna such that the at least one component electrically contacts the antenna.

7. The method in accordance with claim 5, further comprising the steps of:
(l) subsequent to step (b), mounting at least one antenna component to the antenna; and
(m) substantially coincident with step (g), reflowably soldering the at least one antenna component to the antenna.

8. The method in accordance with claim 7, wherein the at least one antenna component referred to in step (l) is specific to a frequency band associated with the receiver.

9. A method for assembling an antenna/receiver combination, comprising the steps of:
(a) forming a receiver into printed circuit board material, the receiver having a frequency band associated therewith;
(b) forming an antenna into the printed circuit board material, wherein the antenna is adjacent to and aligned with the receiver;
(c) mounting at least one receiver component on the receiver;
(d) mounting at least one antenna component on the antenna, wherein the at least one antenna component is specific to the frequency band associated with the receiver;
(e) mounting electrical contacts between the receiver and the antenna;
(f) reflowably soldering the receiver and the antenna, including the at least one receiver component, the at least one antenna component, and the electrical contacts;
(g) separating the antenna and the receiver from the printed circuit board material; and
(h) forming the antenna and the receiver into a desired physical orientation.

10. A method for efficiently using the surface area of printed circuit board material to assemble antenna/receiver combinations, the method comprising the steps of:
(a) forming a printed circuit board array of antennas and receivers into the available surface area of the printed circuit board material, the array comprising an equal number of antennas and receivers positioned such that each antenna is adjacent to and aligned with a receiver;
(b) electrically coupling the receivers to the adjacent antennas to form the antenna/receiver combinations; and
(c) separating the antenna/receiver combinations from the printed circuit board material.

11. The method in accordance with claim 10, further comprising the step of:
(d) subsequent to step (c), forming the antenna/receiver combinations into desired physical orientations.

12. The method in accordance with claim 10, wherein step (b) comprises the steps of:
(e) mounting electrical contacts between the receivers and the adjacent antennas; and
(f) reflowably soldering the electrical contacts between the receivers and the adjacent antennas to form the antenna/receiver combinations.

13. The method in accordance with claim 10, further comprising the step of:
(g) subsequent to step (a), mounting components to the receivers such that the components electrically contact the receivers.

14. The method in accordance with claim 12, further comprising the steps of:
(h) subsequent to step (a), mounting receiver components on the receivers; and
(i) substantially coincident with step (f), reflowably soldering the receiver components to the receivers.

15. The method in accordance with claim 10, further comprising the step of:
(j) subsequent to step (a), mounting components to the antennas such that the components electrically contact the antennas.

16. The method in accordance with claim 14, further comprising the steps of:
(k) subsequent to step (a), mounting antenna components on the antennas; and
(l) substantially coincident with step (f), reflowably soldering the antenna components to the antennas.

17. The method in accordance with claim 16, wherein the antenna components referred to in step (k) are specific to frequency bands associated with the adjacent receivers.

* * * * *